(12) United States Patent
Farooq et al.

(10) Patent No.: US 11,282,716 B2
(45) Date of Patent: Mar. 22, 2022

(54) INTEGRATION STRUCTURE AND PLANAR JOINING

(71) Applicant: INTERNATIONAL BUSINESS MACHINES CORPORATION, Armonk, NY (US)

(72) Inventors: Mukta Ghate Farooq, Hopewell Junction, NY (US); James Kelly, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/678,019

(22) Filed: Nov. 8, 2019

(65) Prior Publication Data

US 2021/0143022 A1    May 13, 2021

(51) Int. Cl.
| | |
|---|---|
| *H01L 23/538* | (2006.01) |
| *H01L 21/48* | (2006.01) |
| *H01L 25/065* | (2006.01) |
| *H01L 25/00* | (2006.01) |
| *H01L 23/31* | (2006.01) |

(52) U.S. Cl.
CPC ...... *H01L 21/4853* (2013.01); *H01L 21/4857* (2013.01); *H01L 23/3121* (2013.01); *H01L 23/5381* (2013.01); *H01L 23/5386* (2013.01); *H01L 25/0655* (2013.01); *H01L 25/50* (2013.01)

(58) Field of Classification Search
CPC ............. H01L 21/4853; H01L 23/5381; H01L 23/5386; H01L 25/50; H01L 21/4857
See application file for complete search history.

(56) References Cited

U.S. PATENT DOCUMENTS

| | | | | |
|---|---|---|---|---|
| 5,940,729 A | * | 8/1999 | Downes, Jr | H01L 24/16 438/613 |
| 6,219,253 B1 | | 4/2001 | Green | |
| 6,995,084 B2 | * | 2/2006 | Srivastava | H01L 24/03 438/613 |
| 7,563,651 B2 | * | 7/2009 | Kawata | H01L 21/4871 438/125 |
| 7,906,852 B2 | | 3/2011 | Nishimura et al. | |
| 8,293,574 B2 | | 10/2012 | Mihara | |
| 8,410,595 B2 | | 4/2013 | Kroehnert et al. | |

(Continued)

FOREIGN PATENT DOCUMENTS

WO    WO2018125255 A1    7/2018

*Primary Examiner* — Eugene Lee
(74) *Attorney, Agent, or Firm* — Tutunjian & Bitetto, P.C.; L. Jeffrey Kelly

(57) ABSTRACT

A method of forming a planarized integration structure is provided. The method includes forming at least two conductive pillars on a packaging substrate, wherein the packaging substrate has a positive or convex meniscus shape. The method further includes placing a bridging die on the packaging substrate between an adjacent pair of the at least two conductive pillars, wherein the bridging die includes one or more conductive interconnects. The method further includes forming a cover layer on the substrate over the at least two conductive pillars and the bridging die, and planarizing the conductive pillars and the one or more conductive interconnects.

15 Claims, 6 Drawing Sheets

(56) References Cited

U.S. PATENT DOCUMENTS

| | | | |
|---|---|---|---|
| 8,546,954 B2* | 10/2013 | Kwon | H01L 25/105 257/777 |
| 9,059,241 B2* | 6/2015 | Interrante | H01L 24/81 |
| 9,247,636 B2* | 1/2016 | Hoffmeyer | G06F 30/39 |
| 9,378,987 B2* | 6/2016 | Kim | H01L 23/5385 |
| 9,601,458 B2* | 3/2017 | Kwon | H01L 23/48 |
| 9,613,922 B2 | 4/2017 | Kado et al. | |
| 9,786,644 B2* | 10/2017 | Shi | H01L 23/49811 |
| 9,842,809 B2 | 12/2017 | Moon et al. | |
| 9,922,924 B1 | 3/2018 | Shih | |
| 9,966,303 B2 | 5/2018 | Oganesian et al. | |
| 10,431,537 B1* | 10/2019 | Pietambaram | H01L 21/486 |
| 2007/0152350 A1* | 7/2007 | Kim | H01L 23/49838 257/786 |
| 2007/0164445 A1* | 7/2007 | Ejima | H05K 1/111 257/777 |
| 2008/0036050 A1 | 2/2008 | Lin et al. | |
| 2009/0002973 A1* | 1/2009 | Watanabe | H05K 3/0014 361/820 |
| 2009/0275172 A1* | 11/2009 | Suzuki | H01L 24/29 438/109 |
| 2011/0068481 A1 | 3/2011 | Park et al. | |
| 2011/0233771 A1* | 9/2011 | Kwon | H01L 23/49838 257/737 |
| 2012/0020040 A1 | 1/2012 | Lin et al. | |
| 2014/0353827 A1* | 12/2014 | Liu | H01L 23/5383 257/751 |
| 2016/0240435 A1* | 8/2016 | Geissler | H01L 21/4853 |
| 2019/0131283 A1* | 5/2019 | Chen | H01L 23/481 |
| 2019/0206792 A1* | 7/2019 | Collins | H01L 25/0655 |
| 2019/0304912 A1* | 10/2019 | Ecton | H01L 23/5381 |
| 2019/0333861 A1* | 10/2019 | Pietambaram | H01L 23/5386 |
| 2019/0355642 A1* | 11/2019 | Brown | H01L 23/31 |
| 2020/0035625 A1* | 1/2020 | Wang | H01Q 21/062 |
| 2020/0058627 A1* | 2/2020 | Chen | H01L 23/5384 |
| 2020/0105675 A1* | 4/2020 | Yu | H01L 23/5383 |
| 2020/0176284 A1* | 6/2020 | Mizumura | H01L 27/1285 |
| 2020/0286847 A1* | 9/2020 | Liu | H01L 25/50 |
| 2020/0335443 A1* | 10/2020 | Sun Zhou | H01L 23/5386 |
| 2020/0395300 A1* | 12/2020 | Xie | H01L 25/0655 |
| 2021/0028080 A1* | 1/2021 | Pietambaram | H01L 21/486 |
| 2021/0057352 A1* | 2/2021 | Agarwal | H01L 21/565 |

* cited by examiner

INTEGRATION STRUCTURE AND PLANAR JOINING

BACKGROUND

The present invention generally relates to integration structures and joining methods, and more particularly to integration structures for planar joining in integrated circuit (IC) packaging.

Integration structures can provide electrical lines that connect integrated circuit (IC) components (e.g., dies) to packaging components to facilitate electrical connections with printed circuit boards (PCBs) or other external mounting surfaces. An integration structure may provide different contact densities for connecting ultra-high density IC connections to larger, lower density electrical contacts on the package.

SUMMARY

In accordance with an embodiment of the present invention, a method of forming a planarized integration structure is provided. The method includes forming at least two conductive pillars on a packaging substrate, wherein the packaging substrate has a positive or convex meniscus shape. The method further includes placing a bridging die on the packaging substrate between an adjacent pair of the at least two conductive pillars, wherein the bridging die includes one or more conductive interconnects. The method further includes forming a cover layer on the substrate over the at least two conductive pillars and the bridging die, and planarizing the conductive pillars and the one or more conductive interconnects.

In accordance with another embodiment of the present invention, a method of forming a planarized integration structure is provided. The method includes forming a plurality of conductive pillars on a packaging substrate, wherein each of the conductive pillars is on a top surface pad on the packaging substrate, and wherein the packaging substrate has a positive or convex meniscus shape. The method further includes placing a bridging die on the substrate between an adjacent pair of the at least two conductive pillars, wherein the bridging die includes one or more conductive interconnects, and forming a cover layer on the substrate over the at least two conductive pillars and the bridging die. The method further includes planarizing the conductive pillars and the one or more conductive interconnects, and attaching a top die to at least one of the adjacent pair of the at least two conductive pillars and at least one of the one or more conductive interconnects using conductive bonding contacts.

In accordance with yet another embodiment of the present invention, an integration structure is provided. The integration structure includes a packaging substrate, wherein the packaging substrate has a positive or convex meniscus shape. The integration structure further includes at least two conductive pillars on the packaging substrate, and a bridging die on the packaging substrate between an adjacent pair of the at least two conductive pillars, wherein the bridging die includes one or more conductive interconnects, and wherein the top surfaces of the at least two conductive pillars and conductive interconnect(s) are coplanar in a surface plane. The integration structure further includes a top die attached to at least one of the adjacent pair of the at least two conductive pillars and at least one of the one or more conductive interconnects by conductive bonding contacts.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a method of avoiding non-planar bonding mismatches between features on a warped packaging substrate and an integrated circuit die placed on the warped packaging substrate. Non planarity and warpage of an organic packaging substrate (e.g., a laminate) can cause major dimensional mismatches and distortion of a chip that is electrically joined to features already on the warped substrate. Planarizing the features already on the warped packaging substrate before joining integrated circuit dies to the substrate features can avoid the dimensional mismatch and distortion.

Embodiments of the present invention provide a warped packaging substrate with planarized features for joining integrated circuit dies. The planarized features can have uniform surfaces in essentially the same plane, where the plane is not parallel with the convex surface of the warped packaging substrate. Electronic components can be electrically bonded to the planarized surfaces.

Exemplary applications/uses to which the present invention can be applied include, but are not limited to: integrated circuit packaging and application specific integrated circuits (ASICs).

It is to be understood that aspects of the present invention will be described in terms of a given illustrative architecture; however, other architectures, structures, substrate materials and process features and steps can be varied within the scope of aspects of the present invention.

Figure 1:
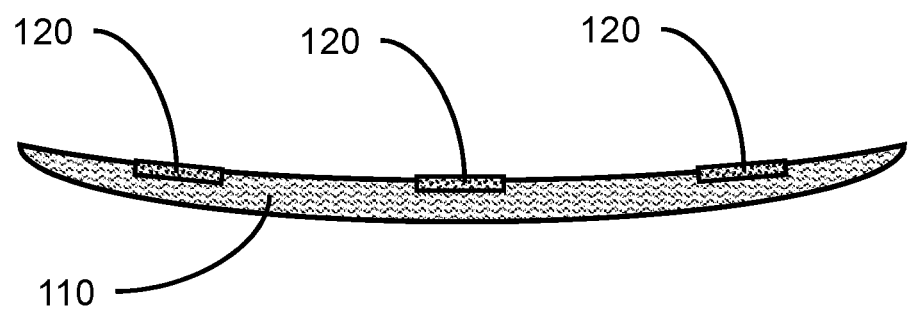
FIG. 1 is a cross-sectional side view showing a warped packaging substrate with pre-placed top surface pads, in accordance with an embodiment of the present invention.

Referring now to the drawings in which like numerals represent the same or similar elements and initially to FIG. 1, a cross-sectional side view of a warped packaging substrate with pre-placed top surface pads is shown, in accordance with an embodiment of the present invention.

In one or more embodiments, a packaging substrate 110 can be an organic packaging substrate or a laminated packaging substrate. The packaging substrate 110 can have a curved shaped, for example, a positive or convex meniscus shape, where the bonding surface curves upwards, that is warps, towards the periphery of the substrate due to internal stresses. In various embodiments, the packaging substrate 110 can be made of a core, which can be an organic material, including, but not limited to, organic polymers, polymer-fiberglass laminates, and organic resins, upon which build-up layers can be formed. The build-up layers can include, but are not limited to, organic polymers and other dielectric materials. The packaging substrate 110 can be an epoxy-based laminate or resin-based laminate. The packaging substrate 110 can provide a final IC package mechanical support and a base for attachment of other components and wiring.

In various embodiments, the packaging substrate 110 can have a thickness in a range of about 0.6 millimeters (mm) to about 2 mm, or about 1 mm to about 1.5 mm, although other thicknesses are also contemplated.

In various embodiments, the packaging substrate 110 can be warped or curved, such that there is a change in height of about 15 microns (um) to about 50 microns per 10 mm length, or about 15 um to about 25 um per 10 mm length, thereby having a non-planarity. If the non-planarity exceeds a certain amount, it may not be possible to join chips of certain x-y size and C4 pitch to the packaging substrate 110. The co-planarity level i.e. maximum allowable non-planarity is specified as an acceptance criterion. This maximum allowed non-planarity can be estimated by the thickness of the solder joint (also referred to as bonding contacts) and the largest dimension across the chip being attached; it can be shown that the thinner the solder joint and the larger the chip, the less tolerance exists for non-planarity (if the chip is too large then even a small warpage adds up to a large displacement in height over a longer distance; conversely, a thin solder joint (also referred to as bonding contacts), for example, having a thickness in a range of about 10 microns (um) to about 20 um, narrows the range of height at which the chip surface needs to be located in order to have enough solder in the connection, compared to a thick solder connection, for example, in a range of about 75 um to about 100 um). As functionality is added to chips, they tend to become larger, especially for high-performance computing applications. As bandwidth requirements increase, a larger number of chip to chip connections become involved, forcing these connections to be made at tighter pitch (and hence typically thinner solder connections).

In various embodiments, the packaging substrate 110 can have top surface pads 120 formed on a concave curved surface of the substrate 110, where the pre-placed top surface pads 120 can be a conductive material. In other embodiments, top surface pads 120 can be formed on an exposed surface of the packaging substrate 110 using masking, lithography, etching, and deposition techniques. The top surface pads 120 can be formed on the top surface of the substrate 110.

In various embodiments, the top surface pads 120 can be a conductive material, including, but not limited to, a metal, for example, tungsten (W), aluminum (Al), copper (Cu), silver (Ag), gold (Au), nickel (Ni), palladium (Pd), platinum (Pt), cobalt (Co), tantalum (Ta); a metallic compound, for example, titanium nitride (TiN), tantalum nitride (TaN), titanium carbide (TiC), tantalum carbide (TaC), molybdenum disilicide ($MoSi_2$), conductive carbons, for example, nanotubes, and graphene/graphite, and combinations thereof.

Figure 2:
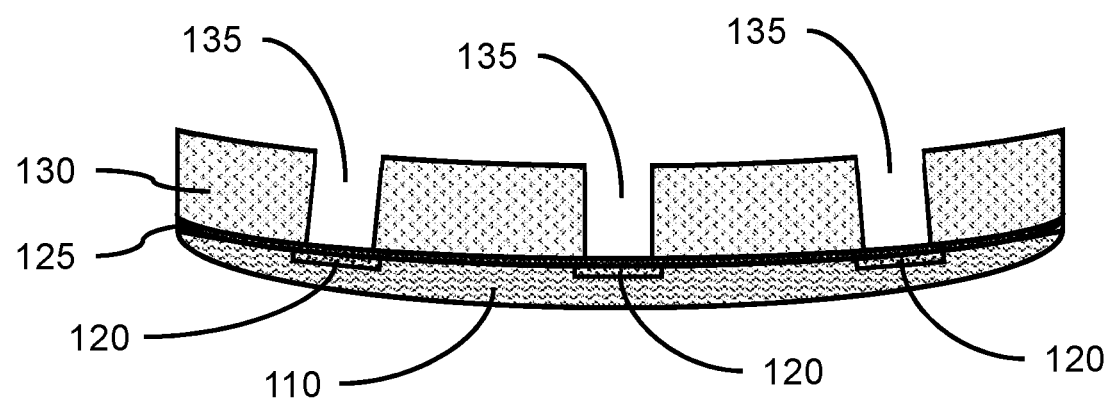
FIG. 2 is a cross-sectional side view showing a seed layer on the substrate, a masking layer on the seed layer, and openings in a masking layer over the pre-placed top surface pads on the packaging substrate, in accordance with an embodiment of the present invention.

FIG. 2 is a cross-sectional side view showing a seed layer on the substrate, a masking layer on the seed layer, and openings in a masking layer over the pre-placed top surface pads on the packaging substrate, in accordance with an embodiment of the present invention.

In one or more embodiments, a blanket seed layer 125 can be formed on top of the top surface pads 120 and packaging substrate 110. The blanket seed layer 125 can be a metal that is conductive and easily removed by a wet chemical etch, for example, copper (Cu), cobalt (Co), nickel (Ni), zinc (Zn), and combinations thereof. The blanket seed layer 125 can be applied by physical vapor deposition (PVD), although other methods such as electroless deposition could be used.

In various embodiments, the thickness of the blanket seed layer 125 can be in the range of about 50 nanometers (nm) to about 100 nm, or about 65 nm to about 85 nm, although other thicknesses are also contemplated.

In one or more embodiments, a masking layer 130 can be formed on the top surface of the warped packaging substrate 110 and blanket seed layer 125 deposited over the exposed surfaces of the top surface pads 120, where the masking layer can be a resist material, for example, a thick photoresist such as a dry film resist. The masking layer 130 can be formed by a blanket deposition, for example, a spin-on process, or a laminated resist.

In various embodiments, the masking layer 130 can have a thickness in a range of about 50 microns (um) to about 250 um, or about 50 um to about 100 um, or about 100 um to about 250 um, or about 100 um to about 200 um, although other thicknesses are also contemplated. The masking layer 130 can have a uniform thickness on the surface of the warped substrate causing the masking layer 130 to also have a concave curved surface comparable to the surface of the substrate 110. The top surface at the periphery of the masking layer 130 can, therefore, be higher than the top surface of the masking layer 130 at the center of the substrate.

In various embodiments, the masking layer 130 can be patterned using lithography techniques and development of the resist material to form openings 135 above the top surface pads 120. In various embodiments, the widths of the openings 135 can be less than the widths of the top surface pads 120. The openings 135 may be formed at a slight incline in the masking layer 130 due to the resulting curved surfaces and warpage from stresses after the substrate 110 is released from a chuck or other holding apparatus initially holding the substrate 110 against a flat surface.

Figure 3:
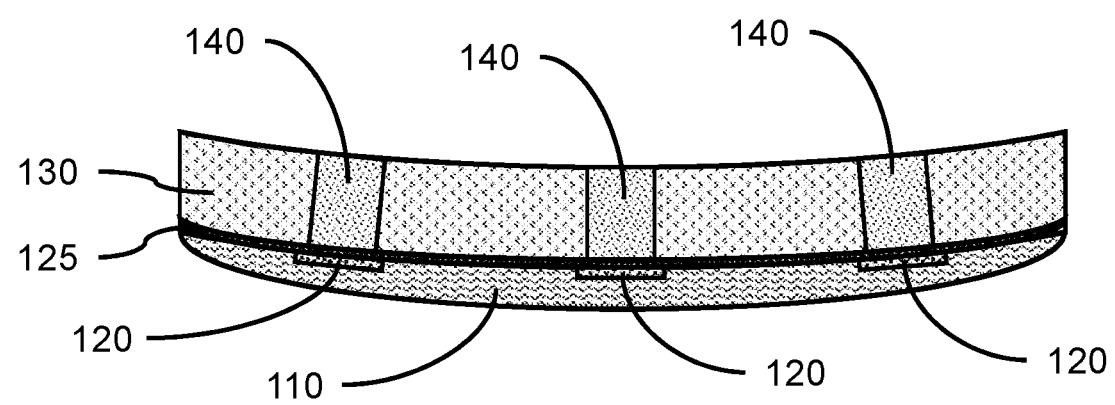
FIG. 3 is a cross-sectional side view showing conductive pillars formed in the openings on the pre-placed top surface pads of the packaging substrate, in accordance with an embodiment of the present invention.

FIG. 3 is a cross-sectional side view showing conductive pillars formed in the openings on the pre-placed top surface pads of the packaging substrate, in accordance with an embodiment of the present invention.

In various embodiments, the openings 135 in the masking layer 130 can be filled with a conductive material, including, but not limited to, a metal, for example, copper (Cu), silver (Ag), gold (Au), nickel (Ni), palladium (Pd), platinum (Pt), cobalt (Co), and combinations thereof. The openings in the masking layer 130 can be filled using a blanket deposition, for example, electrode or electroless plating to the blanket seed layer 125. This can be accomplished by plating the metal through the masking layer 130 onto the blanket seed layer 125 covered top surface pads 120 by making electrical contact to the blanket seed layer 125 and immersing the substrate 110 and resist in a suitable plating electrolyte solution. The filling of the openings can form conductive pillars 140 on the pre-placed top surface pads 120 of the packaging substrate 110. Due to the curvature of the warped packaging substrate 110, the top surfaces of the masking layer 130 and conductive pillars 140 may not be co-planar, but instead inclined at different angles depending on the distances from the center of the substrate towards the periphery. The top surfaces of the conductive pillars 140 can also be at different heights from each other depending on their location on the warped packaging substrate 110. The difference in heights can be up to about 100 um, or about 50 um to about 100 um.

Figure 4:
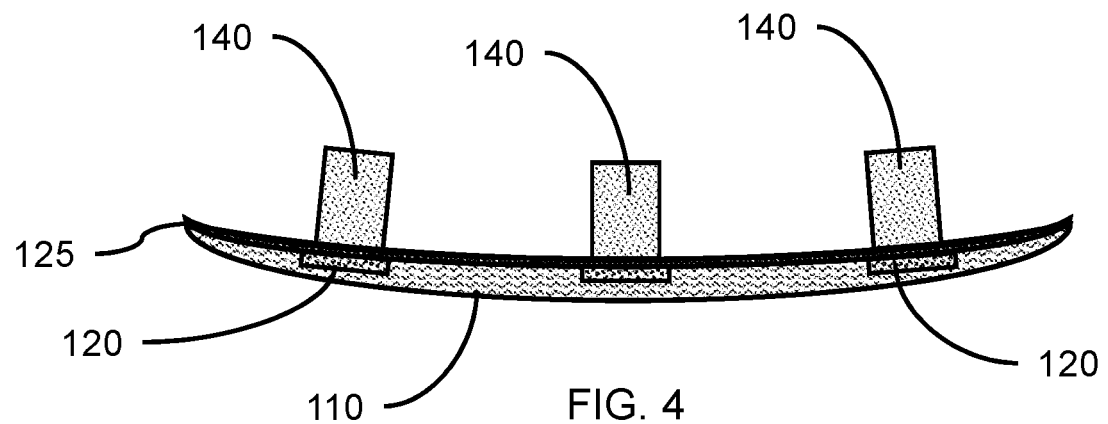
FIG. 4 is a cross-sectional side view showing the masking layer removed while the seed layer and conductive pillars remain on the pre-placed top surface pads and packaging substrate, in accordance with an embodiment of the present invention.

FIG. 4 is a cross-sectional side view showing the masking layer removed while the seed layer and conductive pillars remain on the pre-placed top surface pads and packaging substrate, in accordance with an embodiment of the present invention.

In one or more embodiments, the masking layer 130 can be removed using a chemical strip to leave the conductive pillars 140 on the pre-placed top surface pads 120. The conductive pillars 140 may not be parallel and the top surfaces of the conductive pillars 140 may not be coplanar.

In one or more embodiments, the blanket seed layer 125 may then be removed by a suitable wet chemical etch, since the seed layer is much thinner than the dimensions of the pillars 140, there can be minimal etching on the pillars. A simple wet solution of dilute sulfuric acid and hydrogen peroxide could be used to remove the seed layer 125 in the case of Cu, for example. A portion of the blanket seed layer can remain between the top surface pads 120 and the conductive pillars 140.

Figure 5:
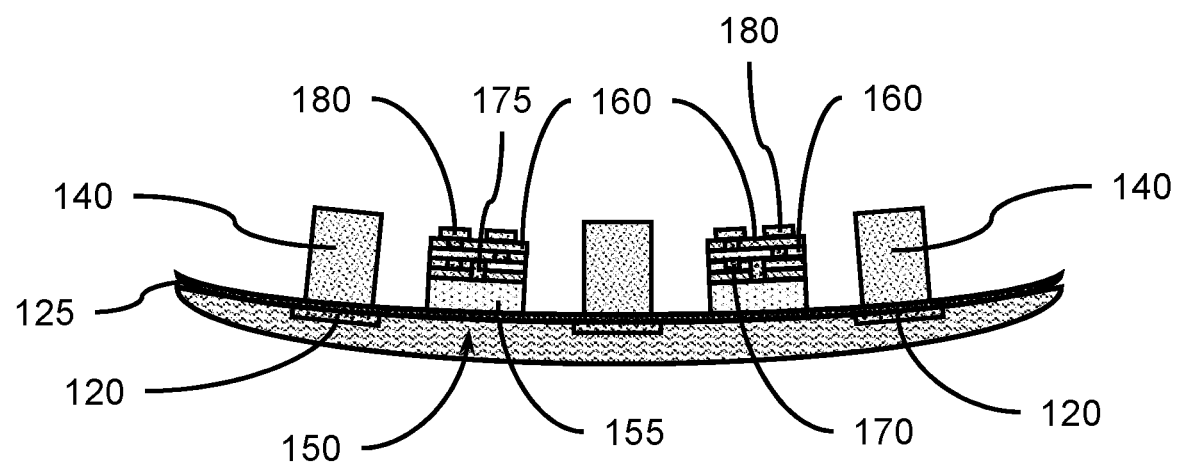
FIG. 5 is a cross-sectional side view showing a plurality of bridging dies placed on the surface of the warped packaging substrate, in accordance with an embodiment of the present invention.

FIG. 5 is a cross-sectional side view showing a plurality of bridging dies placed on the surface of the warped packaging substrate, in accordance with an embodiment of the present invention.

In one or more embodiments, one or more bridging dies 150 can be placed on the top surface of the packaging substrate 110, where the bridging dies can be placed between two adjacent conductive pillars 140. The bridging dies 150 can be affixed to the surface of the packaging substrate 110 using, for example, double-faced adhesive. The adhesives can be polymers, such as epoxies, silicones, or acrylics.

In various embodiments, the bridging dies 150 can be a distance from each of the adjacent conductive pillars 140 in a range of about 100 microns to about 2000 microns, or about 100 microns to about 500 microns, although other distances are also contemplated.

In various embodiments, the bridging dies 150 can have a height in a range of about 30 microns to about 800 microns, or about 30 microns to about 500 microns, or about 30 microns to about 200 microns, although other heights are also contemplated. The bridging dies 150 can have a height less than the height of the conductive pillars 140 (i.e., the conductive pillars can be taller than the bridging dies), where the top surface of a conductive interconnect 180 can define a top surface of a bridging die 150.

Figure 6:
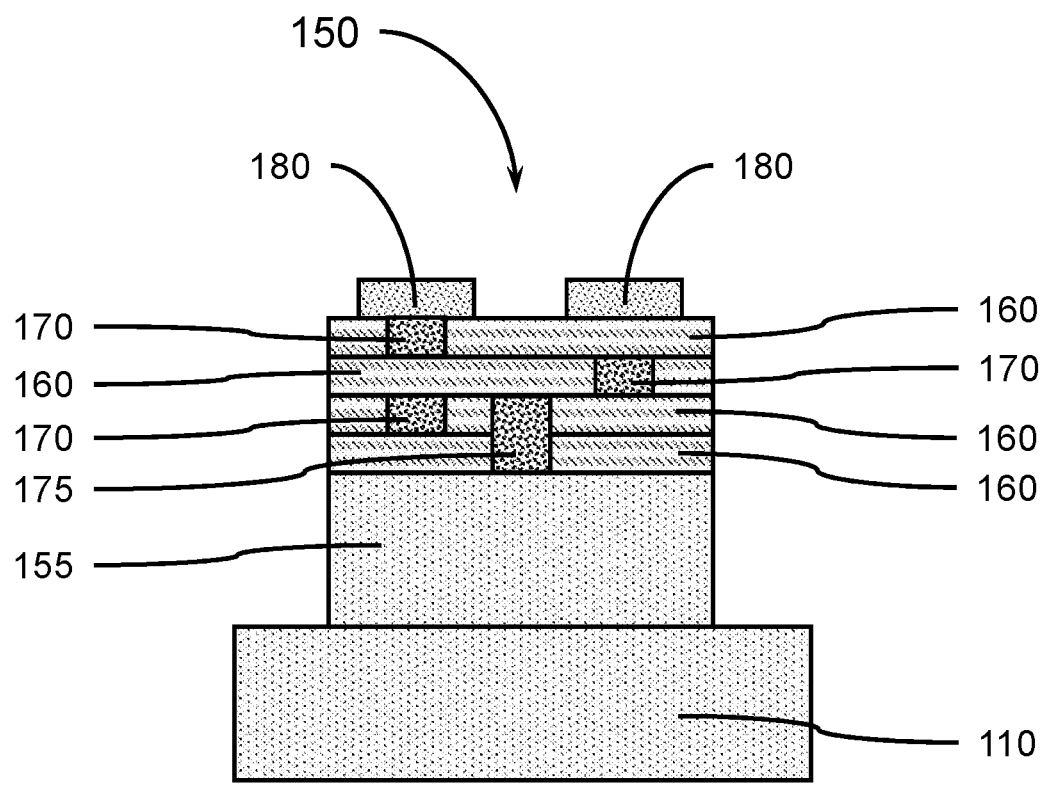
FIG. 6 is a close-up cross-sectional side view of a bridge die with conductive interconnects in alternating metallization and dielectric layers, in accordance with an embodiment of the present invention.

FIG. 6 is a close-up cross-sectional side view of a bridge die with conductive interconnects in alternating metallization and dielectric layers on a semiconductor chip, in accordance with an embodiment of the present invention.

In various embodiments, the bridge die 150 can include a semiconductor chip 155, a plurality of dielectric layers 160 and conductive lines 170 in the dielectric layers 160, and one or more conductive interconnect(s) 180 on an exposed surface of the dielectric layers for forming external electrical contacts. The conductive interconnect(s) 180 can provide electrical connections between semiconductor devices and external electrical connection of the IC package. The conductive lines 170 can be formed in each of the dielectric layers 160 by forming a trench and filling the trench with a conductive material. Additional dielectric layers 160 can be formed on underlying dielectric layers 160 with additional conductive lines 170 and vias 175 formed in each dielectric layer 160. The conductive lines 170 and vias can electrically connect semiconductor devised on the semiconductor chip 155 to other chips and external electrical leads.

In various embodiments, the conductive lines 170 and conductive interconnect(s) 180 can be a conductive material, including, but not limited to, a metal, for example, tungsten (W), aluminum (Al), copper (Cu), silver (Ag), gold (Au), nickel (Ni), palladium (Pd), platinum (Pt), cobalt (Co), tantalum (Ta); a metallic compound, for example, titanium nitride (TiN), tantalum nitride (TaN), titanium carbide (TiC), tantalum carbide (TaC), molybdenum disilicide ($MoSi_2$); conductive carbons, for example, nanotubes, graphene/graphite; and combinations thereof.

Figure 7:
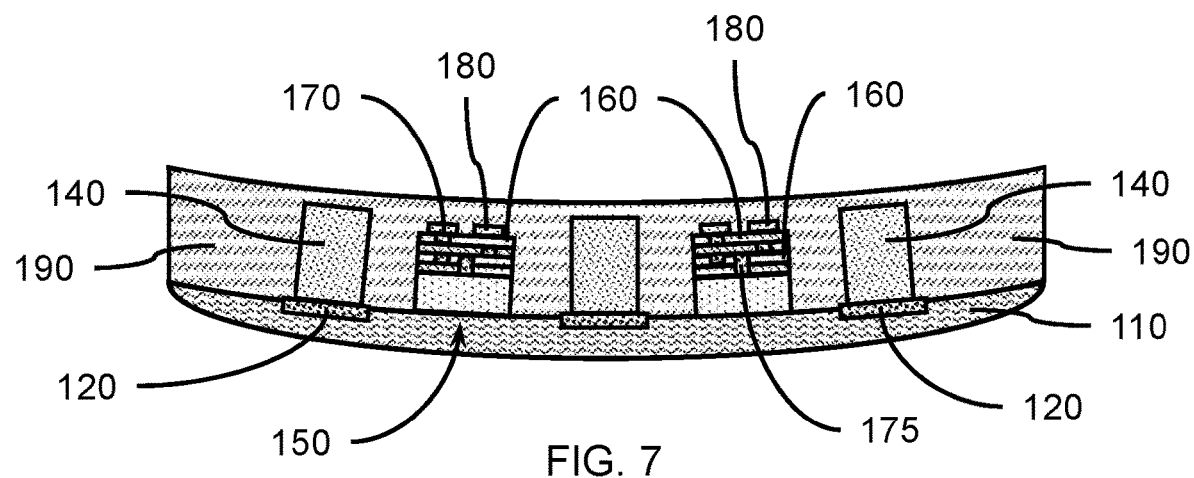
FIG. 7 is a cross-sectional side view showing a cover layer formed on the plurality of bridging dies and conductive pillars, in accordance with an embodiment of the present invention.

FIG. 7 is a cross-sectional side view showing a cover layer formed on the plurality of bridging dies and conductive pillars, in accordance with an embodiment of the present invention.

In one or more embodiments, the bridge dies 150, conductive pillars 140, top surface pads 120, and packaging substrate 110 can be covered by a cover layer 190, where the cover layer can be formed by a blanket deposition. The cover layer 190 can be formed on the top surfaces of the conductive pillars 140 and conductive interconnect(s) 180, so the bridge dies 150, conductive pillars 140, top surface pads 120, and packaging substrate 110 can be embedded in the cover layer 190. The cover layer 190 can provide structural rigidity for subsequent processing of the conductive pillars 140 and conductive interconnect(s) 180. The cover layer 190 can have a concave curved top surface.

In various embodiments, the cover layer 190 can be over-mold compound, which can be an epoxy-based material, also referred to as "underfill" materials.

Figure 8:
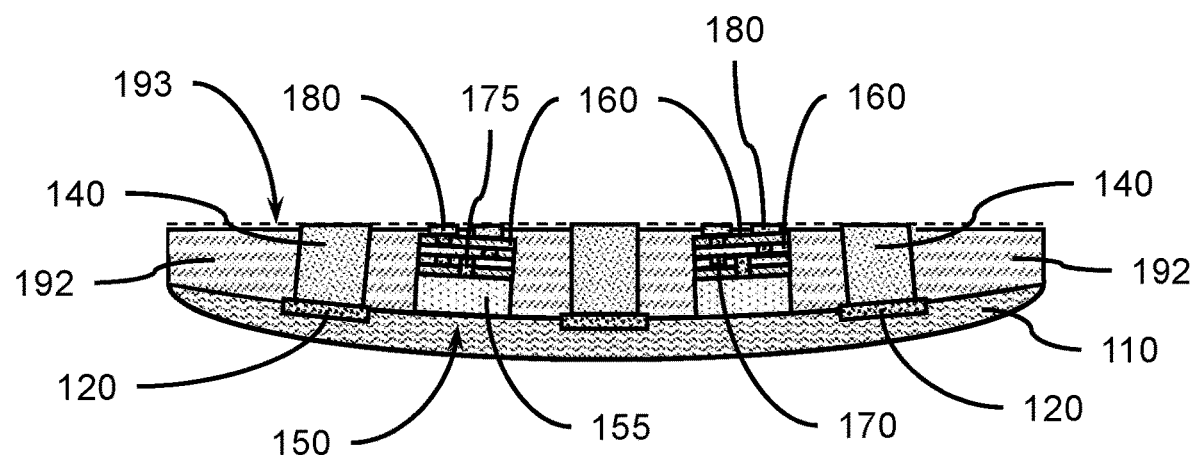
FIG. 8 is a cross-sectional side view showing the removal of an upper portion of the cover layer to expose a top surface of the bridging dies and conductive pillars, where the top surfaces are planarized, in accordance with an embodiment of the present invention.

FIG. 8 is a cross-sectional side view showing the removal of an upper portion of the cover layer to expose a top surface of the bridging dies and conductive pillars, where the top surfaces are planarized, in accordance with an embodiment of the present invention.

In one or more embodiments, the portions of the cover layer 190 can be removed using a chemical-mechanical polishing (CMP) to expose the top surfaces of the conductive pillars 140 and conductive interconnect(s) 180. The CMP can also planarize the conductive pillars 140 and conductive interconnect(s) 180, such that the top surfaces of the conductive pillars 140 and conductive interconnect(s) 180 become coplanar in a surface plane 193. The CMP process can provide increased removal of the cover layer 190 to form a cover layer slab 192 with a reduced height and uniform top surface, which can be below the top surfaces of the conductive pillars 140 and conductive interconnect(s) 180, for example, due to dishing. The top surfaces of the conductive pillars 140 and conductive interconnect(s) 180 can be at different angles from their original orientation due to the CMP planarization, so the top surfaces of the conductive pillars 140 and conductive interconnect(s) 180 are flat and in the same plane 193, and the cover layer slab 192 can have a planarized top surface from the CMP that removes the initial concave shape. The conductive pillars 140 can also have a reduced height from the CMP, where the reduction in height can be a small fraction of the conductive pillar's 140 initial height.

In various embodiments, a wet cleaning can be used to remove metals that may remain on the exposed surfaces. The wet clean can be deionized (DI) water with a dilute acid, for example, a high pressure deionized water with a dilute sulfuric acid.

Figure 9:
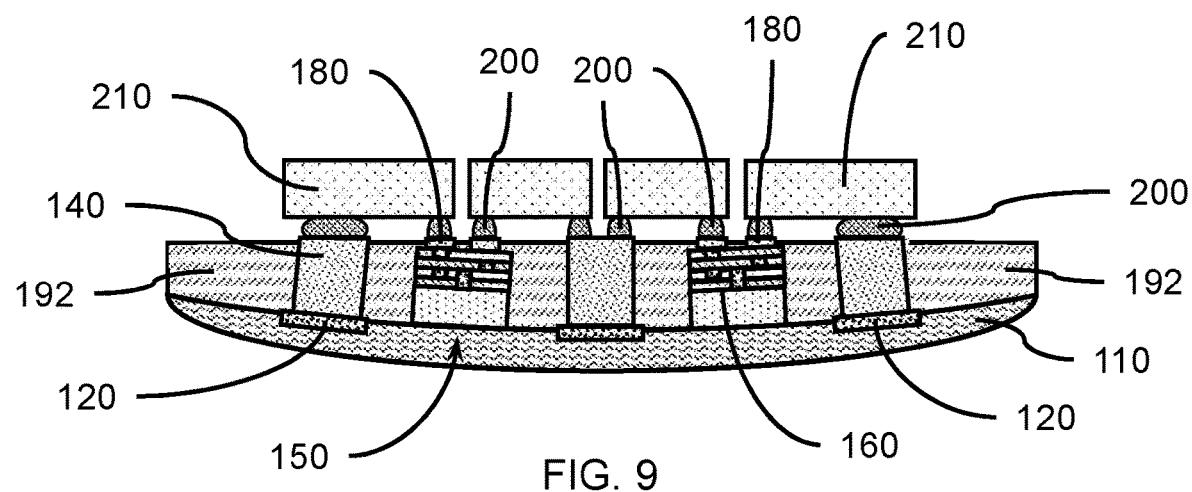
FIG. 9 is a cross-sectional side view showing top dies placed in electrical contact with the conductive pillars and conductive interconnects using conductive bonding contacts, in accordance with an embodiment of the present invention.

FIG. 9 is a cross-sectional side view showing top dies placed in electrical contact with the conductive pillars and conductive interconnects using conductive bonding contacts, in accordance with an embodiment of the present invention.

In one or more embodiments, one or more top dies 210 can be placed on and in electrical contact with the planarized conductive pillars 140 and conductive interconnect(s) 180, where the top dies 210 can be electrically connected to the conductive pillars 140 and conductive interconnect(s) 180 by conductive bonding contacts 200. In various embodiments, the conductive bonding contacts 200 can be, for example, solder beads attached to the top die 210, where the conductive bonding contacts 200 can be Sn alloys e.g. Sn with Ag, Cu, or other metals, alone or in combination. Also Cu—Cu bonds can be formed. The top dies 210 can have a uniform spacing above the conductive pillars 140 and conductive interconnect(s) 180 due to the coplanarity of the top surfaces, so uniform sized/height solder beads can be used for the electrical connections.

In various embodiments, the conductive bonding contacts 200 can have a thickness in a range of about 10 microns (um) to about 20 um, or in a range of about 75 um to about 100 um, although other thickness are also contemplated.

In various embodiments, the top die(s) 210 can be semiconductor chips including active digital logic and/or memory components, or passive dies including e.g. capacitors, resistors, inductors, or a combination thereof. The top die(s) 210 can be of different heights and different x-y sizes, which can be a benefit, since there is no restriction that they have to be the same height. Electrical contacts in the dies 210 can be placed in contact with the conductive bonding contacts 200 to form electrical connections.

Figure 10:
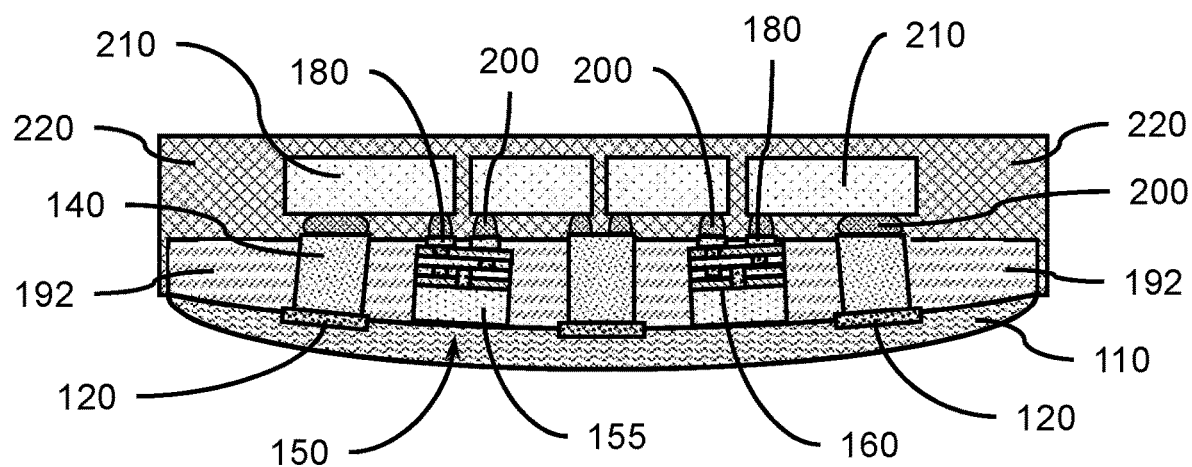
FIG. 10 is a cross-sectional side view showing an encapsulation layer formed around the top dies, conductive bonding contacts, conductive pillars, bridge dies and conductive interconnects, in accordance with an embodiment of the present invention.

FIG. 10 is a cross-sectional side view showing an encapsulation layer formed around the top dies, conductive bonding contacts, conductive pillars, bridge dies and conductive interconnects, in accordance with an embodiment of the present invention.

In one or more embodiments, an encapsulation layer 220 can be formed around the top dies 210, conductive bonding contacts 200, exposed portions of the conductive pillars 140, bridge dies 150, and conductive interconnect 180. The encapsulation layer 220 can be formed by a blanket deposition, for example, an encapsulation dispense process (e.g. where it is dispensed in a line or L shape, and the fluid flows under capillary action, for example, using good hydrophilic surfaces for the flow to occur). Epoxy materials-called "overmold" compounds can be used and liquid dispensed. The surface may be treated by oxygen plasma ashing before dispensing.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a planarized integration structure, comprising:
   forming at least two conductive pillars on a packaging substrate, wherein the packaging substrate has a positive or convex meniscus shape;
   placing a bridging die on the packaging substrate between an adjacent pair of the at least two conductive pillars, wherein the bridging die includes one or more conductive interconnects;
   forming a cover layer on the substrate over the at least two conductive pillars and the bridging die; and
   planarizing the cover layer, conductive pillars, and the one or more conductive interconnects.

2. The method of claim 1, further comprising attaching a top die to at least one of the adjacent pair of the at least two conductive pillars and at least one of the one or more conductive interconnects using conductive bonding contacts.

3. The method of claim 1, wherein the substrate includes at least two top surface pads, wherein one of the at least two conductive pillars is formed on one of the top surface pads.

4. The method of claim 3, further comprising forming a blanket seed layer on the top surface pads and exposed surface of the packaging substrate.

5. The method of claim 4, further comprising forming a masking layer on the blanket seed layer, and forming an opening through the masking layer over each top surface pad.

6. The method of claim 5, wherein the at least two conductive pillars are formed by plating metal onto the blanket seed layer exposed by the openings through the masking layer.

7. The method of claim 5, further comprising removing the masking layer to expose the at least two conductive pillars on the top surface pads.

8. The method of claim 7, wherein the packaging substrate has a positive or convex meniscus shape with a change in height of about 15 microns (um) to about 50 microns per 10 mm length.

9. The method of claim 7, wherein the packaging substrate is an organic laminate.

10. A method of forming a planarized integration structure, comprising:
    forming a plurality of conductive pillars on a packaging substrate, wherein each of the conductive pillars is on a top surface pad on the packaging substrate, and wherein the packaging substrate has a positive or convex meniscus shape;
    placing a bridging die on the substrate between an adjacent pair of the at least two conductive pillars, wherein the bridging die includes one or more conductive interconnects;
    forming a cover layer on the substrate over the at least two conductive pillars and the bridging die;
    planarizing the cover layer, conductive pillars, and the one or more conductive interconnects, wherein the cover layer has a convex surface proximal to the packaging substrate and a flat surface adjacent to the conductive pillars and the one or more conductive interconnects; and attaching a top die to at least one of the adjacent pair of the at least two conductive pillars and at least one of the one or more conductive interconnects using conductive bonding contacts.

11. The method of claim 10, wherein the planarizing of the conductive pillars and the one or more conductive interconnects is done using chemical mechanical polishing.

12. The method of claim 11, wherein the packaging substrate has a thickness in a range of about 0.6 millimeters (mm) to about 2 mm.

13. The method of claim 12, wherein the packaging substrate has a positive or convex meniscus shape with a change in height of about 15 microns (um) to about 50 microns per 10 mm length.

14. The method of claim 13, further comprising forming a blanket seed layer on the top surface pads and exposed surface of the packaging substrate.

15. The method of claim 14, further comprising forming a masking layer on the blanket seed layer, and forming an opening through the masking layer over each top surface pad.

\* \* \* \* \*